(12) United States Patent
Yen et al.

(10) Patent No.: US 7,525,246 B2
(45) Date of Patent: Apr. 28, 2009

(54) ALTERNATING CURRENT LIGHT-EMITTING DEVICE

(75) Inventors: Hsi-Hsuan Yen, Hsinchu Hsien (TW); Wen-Yung Yeh, Hsinchu Hsien (TW); Chih-Shu Huang, Hsinchu Hsien (TW); Kuo Jui Huang, Hsinchu Hsien (TW); Ming-Te Lin, Hsinchu Hsien (TW)

(73) Assignees: Industrial Technology Research Institute, Hsinchu Hsien (TW); Tyntek Corporation, Hsinchu (TW)

( * ) Notice: Subject to any disclaimer, the term of this patent is extended or adjusted under 35 U.S.C. 154(b) by 344 days.

(21) Appl. No.: 11/594,060

(22) Filed: Nov. 8, 2006

(65) Prior Publication Data
US 2008/0042551 A1 Feb. 21, 2008

(30) Foreign Application Priority Data
Aug. 16, 2006 (TW) .............................. 95130037 A

(51) Int. Cl.
*H01J 1/62* (2006.01)
(52) U.S. Cl. ...................................... 313/500; 313/506
(58) Field of Classification Search ................. 313/498, 313/500, 503, 506
See application file for complete search history.

(56) References Cited

U.S. PATENT DOCUMENTS 6,547,249 B2 4/2003 Collins, III et al.
6,957,899 B2 10/2005 Jiang et al.

FOREIGN PATENT DOCUMENTS

CN 1819255 A 8/2006
TW 200501464 8/1993

*Primary Examiner*—Vip Patel
(74) *Attorney, Agent, or Firm*—Birch, Stewart, Kolasch & Birch, LLP

(57) ABSTRACT

An alternating current light-emitting device includes a substrate, an alternating current microdie light-emitting module, and a conductive structure. The alternating current microdie light-emitting module is formed on the substrate and has at least two microdies and a concave portion disposed between the two microdies. Each of the microdies has at least one active layer. The conductive structure electrically connects the microdies and thereby enables the active layers of the microdies to take turns to emit light during positive and negative half cycles of alternating current. The conductive structure is formed in the concave portion and covers an insulator. The present invention prevents undue open circuits but enhances yield.

22 Claims, 2 Drawing Sheets

ALTERNATING CURRENT LIGHT-EMITTING DEVICE

BACKGROUND OF THE INVENTION

1. Field of the Invention

The present invention relates to a light-emitting device, and more particularly, to an alternating current light-emitting device.

2. Description of the Prior Art

As optoelectronic technology develops, light emitting diode (LED) which is one of a variety of light sources is widely used in various fields and plays an important role in the optoelectronic industry. Typically driven by direct current (DC), a conventional LED chip has to operate in conjunction with a control circuit of alternating current to direct current conversion and a voltage reduction component in order to be used in a general living environment dominated by alternating current, thus incurring high manufacturing costs and compromising operation efficiency. Accordingly, it is necessary to develop a LED chip directly driven by alternating current. Since 2005, manufacturers based in the United States, Japan, South Korea and China have been disclosing light emitting diodes directly driven by alternating current (AC LED), indicating that LED AC is regarded as a new generation light-emitting device of great industrial potential.

Taiwanese Patent No. 200501464 and U.S. Pat. Nos. 6,547,249 and 6,957,899 taught a single-chip comprising two or multiple miniaturized light emitting diode dies such that the single-chip is operated under high-voltage alternating current. Similarly designed, the aforesaid patents each comprise at least one alternating current microdie light emitting diode module formed on a chip, the alternating current microdie light emitting diode module comprising at least two microdie light emitting diodes electrically connected to each other, and under alternating current the two microdies take turns to emit light in accordance with circuit connection direction.

The microdies have to be electrically independent of each other in order to take turns to emit light in accordance with different circuits. To achieve this, the microdies have to be spaced apart by a concave portion formed on the surface of the chip and between the microdies by means of etching or by any other means. However, electrical insulation of the microdies by the concave portion inevitably accompanies geometric separation of the microdies; as a result, fabricating a metal film between the microdies to achieve electrical connection is likely to decrease production yield.

Where the metal film is fabricated, by evaporation deposition or sputtering deposition, between the microdies to build an electrical connection path, step coverage of the metal film tends to be unsatisfactory because of a great bend at a corner or due to a vertical sidewall of the microdies, resulting in such problems as poor metal film attachment and uneven thickness of metal film. In consequence, open circuits arise for metal film discreteness. Also, surging metal film resistance compromises LED yield and even LED photoelectric conversion efficiency.

With the prior art being disadvantaged by undue open circuits, low yield, high resistance and inefficient photoelectric conversion, manufacturers nowadays are faced with an urgent issue, that is, an attempt to solve the aforesaid drawbacks of the prior art.

SUMMARY OF THE INVENTION

Accordingly, to solve the aforesaid drawbacks of the prior art, it is a primary objective of the present invention to provide an alternating current light-emitting device to prevent undue open circuits.

Another objective of the present invention is to provide an alternating current light-emitting device to enhance yield.

Yet another objective of the present invention is to provide an alternating current light-emitting device to prevent an increase in resistance.

A further objective of the present invention is to provide an alternating current light-emitting device to enhance photoelectric conversion.

In order to achieve the above and other objectives, the present invention provides an alternating current light-emitting device comprising a substrate, an alternating current microdie light-emitting module, an insulator, and a conductive structure. The alternating current microdie light-emitting module is formed on the substrate and has at least two microdies and a concave portion disposed between the two microdies. Each of the microdies comprises at least one active layer. The insulator is formed in the concave portion. The conductive structure is electrically connected to the microdies and covers the insulator such that, when subjected to alternating current, the active layers of the microdies take turns to emit light during positive and negative half cycles of alternating current.

The insulator fills the concave portion such that the surface of the insulator is flush with that of the microdies. The insulator comprises an insulating filler for filling the concave portion. Preferably, the insulating filler is a material of high resistance, for example Benzo-Cyclo-Butene (BCB), Polyimide, SU8, and Silicon Dioxide. The concave portion comprises either a vertical sidewall or an oblique sidewall.

The conductive structure comprises a conductor electrically connecting two microdies. The conductor is a conductive bridge and is made of a transparent material and thereby is transparent.

The substrate is, for example, a chip, an insulating substrate, an insulating layer formed on a chip, and a material or structure enabling the microdies to be electrically insulated from each other.

Each of the microdies comprises a plurality of active layers. Electrical connection between each of the microdies and the active layers thereof comprises series connection, parallel connection, and a combination of series and parallel connection. Each of the microdies emits light of identical wavelengths and thereby emits monochromatic light of the same color. Or, alternatively, each of the microdies emits light of different wavelengths and thereby emits non-monochromatic light of mixed light colors. Each of the active layers is a luminescent active layer and has individual ohmic electrodes.

To achieve the same objectives, the present invention further provides an alternating current light-emitting device comprising a substrate, an alternating current microdie light-emitting module, and a conductive structure. The alternating current microdie light-emitting module is formed on the substrate and has at least two microdies and an oblique sidewall-equipped concave portion disposed between the two microdies. Each of the microdies comprises at least one active layer. The conductive structure is electrically connected to the microdies and covers the concave portion such that, when subjected to alternating current, the active layers of the microdies take turns to emit light during positive and negative half cycles of alternating current.

The conductive structure comprises a conductor electrically connecting two microdies. The conductor is a conductive bridge and is made of a transparent material and thereby is transparent.

The substrate is, for example, a chip, an insulating substrate, an insulating layer formed on a chip, and a material or structure enabling the microdies to be electrically insulated from each other.

Each of the microdies comprises a plurality of active layers. Electrical connection between each of the microdies and the active layers thereof comprises series connection, parallel connection, and a combination of series and parallel connection. Each of the microdies emits light of identical wavelengths and thereby emits monochromatic light of the same color. Or, alternatively, each of the microdies emits light of different wavelengths and thereby emits non-monochromatic light of mixed light colors. Each of the active layers is a luminescent active layer and has individual ohmic electrodes.

DETAILED DESCRIPTION OF THE PREFERRED EMBODIMENTS

The following specific embodiments are provided to illustrate the present invention. Others ordinarily skilled in the art can readily gain an insight into other advantages and features of the present invention based on the contents disclosed in this specification.

The present invention discloses an alternating current light-emitting device applicable to a substrate, for example, a chip. The alternating current light-emitting device generates monochromatic light or non-monochromatic light when subjected to alternating current. The monochromatic light or non-monochromatic light is displayed on a light-emitting surface of the chip in a full-time manner. The alternating current is preferably electricity supplied to the public under 110V, 100V or 220V and at 60 Hz or 50 Hz, depending on, a country's electricity standard.

First Embodiment

Figure 1A:
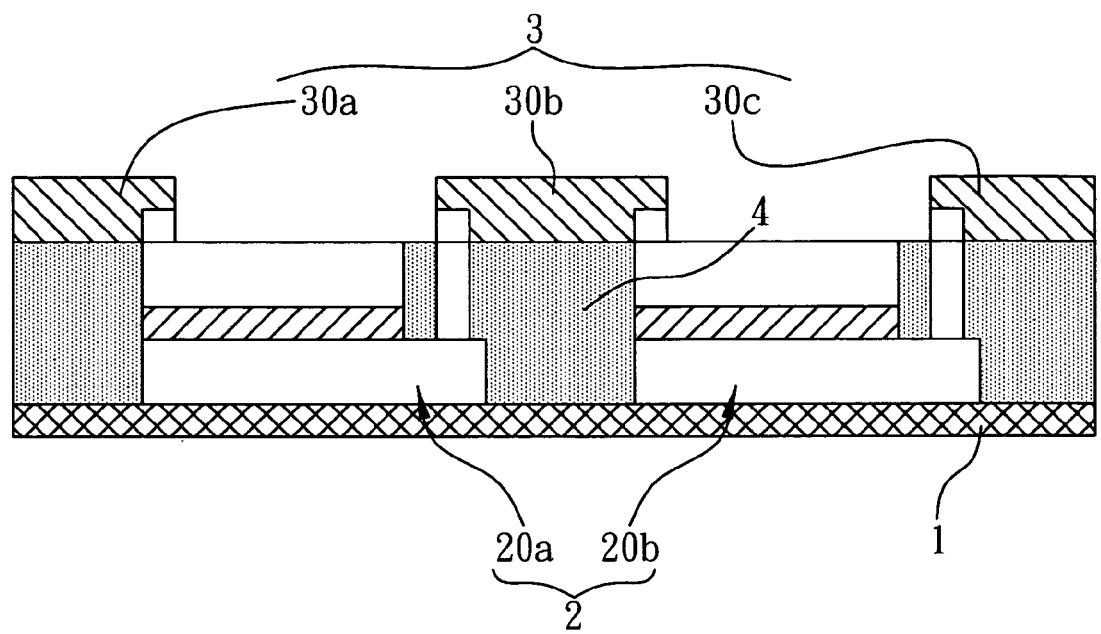
FIG. 1A is a cross-section showing the first embodiment of an alternating current light-emitting device of the present invention.
Figure 1B:
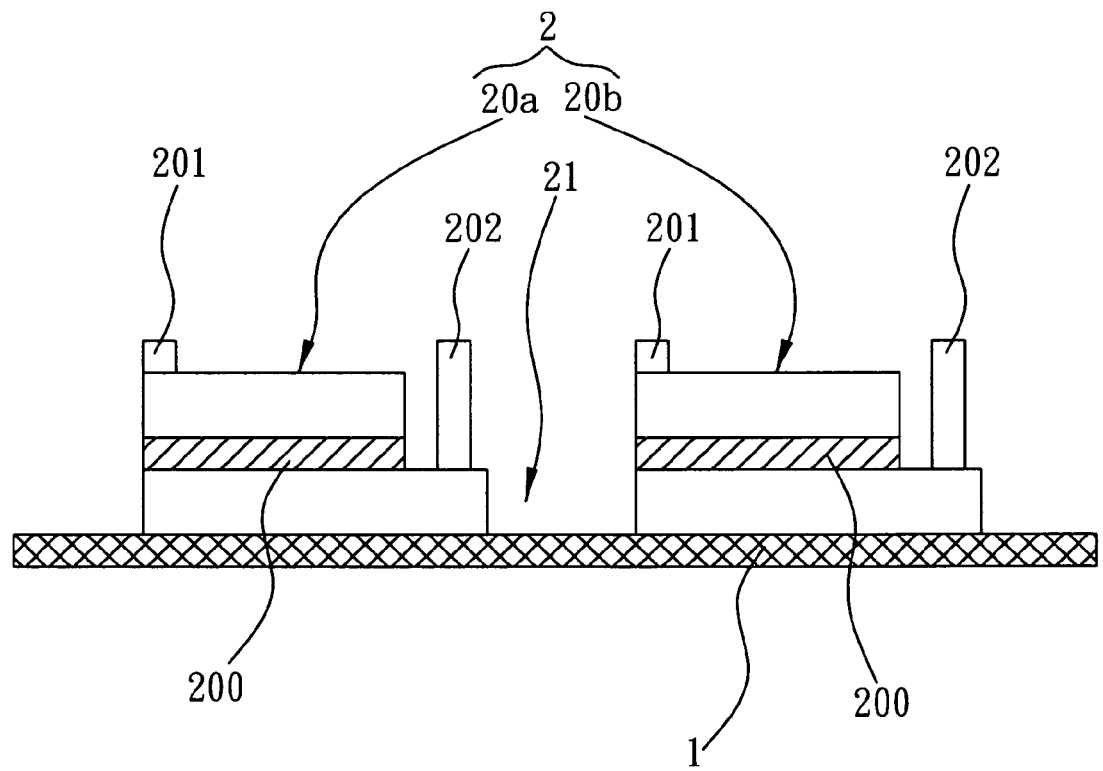
FIG. 1B is a schematic view showing an alternating current microdie light-emitting module in the first embodiment of an alternating current light-emitting device of the present invention.

FIGS. 1A and 1B are drawings showing the first embodiment of an alternating current light-emitting device of the present invention. As shown in the drawings, the alternating current light-emitting device comprises a substrate 1, an alternating current microdie light-emitting module 2, a conductive structure 3, and an insulator 4. The alternating current microdie light-emitting module 2 is formed on the substrate 1 and comprises two microdies 20a and 20b. The conductive structure 3 provides electrical connection. The insulator 4 is formed between the two microdies 20a and 20b. To make this case simpler, the embodiment is exemplified by one alternating current microdie light-emitting module 2 comprising the two microdies 20a and 20b. However, persons ordinarily skilled in the art shall realize that any other embodiment may disclose a plurality of alternating current microdie light-emitting modules when necessary, and that each of the alternating current microdie light-emitting modules may comprises a plurality of microdies when necessary; in other words, both the number of the alternating current microdie light-emitting modules and the number of the microdies disclosed in the embodiment shall not constitute a limitation in the present invention.

The substrate 1 is a chip made of $Al_2O_3$, GaAs, GaP, and SiC, for example. Of course, in any other embodiment, the substrate 1 can also be an insulating substrate, an insulating layer formed on the surface of a chip, or any other material or structure which enables the microdies 20a and 20b to be electrically insulated from each other.

The alternating current microdie light-emitting module 2 comprises at least the two microdies 20a and 20b and a concave portion 21 disposed between the microdies 20a and 20b. Each of the microdies 20a and 20b comprises at least one active layer 200. The active layer 200 is a luminescent active layer and comprises individual ohmic electrodes 201 and 202. When subjected to alternating current, the ohmic electrodes 201 and 202 enable the active layer 200 to emit light.

In the embodiment, the concave portion 21 comprises a vertical sidewall for spacing the two adjacent microdies 20a and 20b apart and thereby electrically insulating the two adjacent microdies 20a and 20b from each other. In the embodiment, the insulator 4 is formed in the concave portion 21. The concave portion 21 is filled with the insulator 4, such that the surface of the insulator 4 is flush with the surface of the microdies 20a and 20b. The insulator 4 is an insulating filler for filling the concave portion 21, for example, a material of high resistance, Benzo-Cyclo-Butene (BCB), Polyimide, SU8, and Silicon Dioxide. The insulator 4 is not limited to one for filling the concave portion 21; instead, whatever material disposed in the concave portion 21 to form the insulator 4 is able to reduce a height difference between the surface of the insulator 4 and the surface of the microdies 20a and 20b. Accordingly, the technical spirit of the present invention will be fulfilled, even if the surface of the insulator 4 is not fully flush with (i.e. is slightly lower or slightly higher than) the surface of the microdies 20a and 20b.

The conductive structure 3 electrically connects the microdies 20a and 20b and covers the insulator 4, such that, when subjected to alternating current, the active layers 200 of the microdies 20a and 20b take turns to emit light during positive and negative half cycles of alternating current. The conductive structure comprises a conductor 30b connecting the microdies 20a and 20b. The conductive structure may also comprise conductors 30a and 30c for connection with an alternating current source. Preferably, each of the conductors 30a, 30b and 30c is a conductive bridge made of any conductive material, such as a metal, and a transparent metal oxide layer capable of electrical conduction.

Although the microdies 20a and 20b disclosed in the embodiment are each exemplified by the active layer 200, person ordinarily skilled in the art shall realize that any other embodiment may, when necessary, disclose a plurality of active layers 200 stacked together in series and the microdies 20a and 20b (connected electrically by the conductive structure 3) connected in parallel. As a result, when subjected to positive half cycles of alternating current, one identical active layer 200 of the microdies 20a and 20b emits light in sequence. Conversely, when subjected to negative half cycles of alternating current, another identical active layer 200 of the microdies 20a and 20b emits light in sequence.

In other words, where the microdies 20a and 20b comprise the two active layers 200 stacked together, two stacked light emitting diodes receive positive and negative half cycles of alternating current, and thus light is emitted during both positive and negative half cycles of alternating current, thus allowing identical active layers of the microdies 20a and 20b to take turns to emit light during positive and negative half cycles of alternating current. Besides, the microdies 20a and 20b emit light of identical wavelengths (and the respective active layers emit light of identical or different wavelengths) such that the light emitted is monochromatic and of the same color. Both the number of the active layers and variation of wavelength fall into the scope of the present invention but are not technical features of the present invention and therefore are not herein described in detail.

Unlike the prior art, this embodiment discloses an alternating current light-emitting device, wherein a concave portion 21 is filled with an insulator 4 such that a substrate 1 has a flat top surface despite a mutual insulation process performed on microdies 20a and 20b. Accordingly, upon completion of its fabrication, a conductive structure 3 has conductors 30b (30a and 30c), such as a conductive bridge, lying horizontally while connecting electrically the microdies 20a and 20b. This embodiment overcomes a drawback of the prior art, that is, poor step coverage. Accordingly, the present invention prevents a conductor (to be specific, a metal film disposed between the microdies and configured for electrical connection) from having uneven thickness or being discrete at a corner, and prevents an increase in the metal film resistance which may otherwise happen due to variation of thickness. Accordingly, the advantages of the present invention are, namely prevention of undue open circuits, prevention of an increase in resistance, enhancement of product yield, and enhancement of photoelectric conversion efficiency.

Second Embodiment

Figure 2:
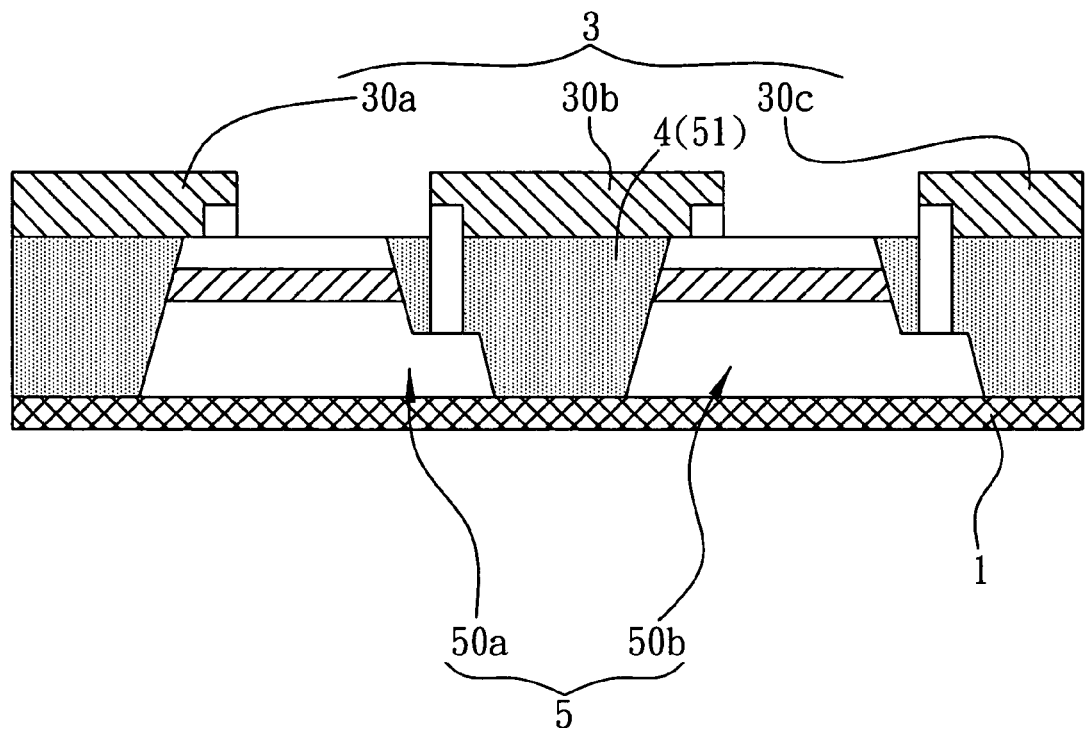
FIG. 2 is a cross-section showing the second embodiment of an alternating current light-emitting device of the present invention.

FIG. 2 is a drawing showing the second embodiment of an alternating current light-emitting device of the present invention. To make the description simpler, like components are denoted alike, and the description rarely goes into detail.

Unlike the second embodiment, the first embodiment discloses a concave portion having a vertical sidewall. By contrast, the second embodiment discloses a concave portion having an oblique sidewall.

FIG. 2 is a cross-section showing the second embodiment of an alternating current light-emitting device of the present invention. The alternating current light-emitting device shown in FIG. 2 comprises a substrate 1, an alternating current microdie light-emitting module 5 formed on the substrate 1 and having two microdies 50a and 50b, a conductive structure 3 providing an electrical connection function and having conductors 30a, 30b and 30c, and an insulator 4 formed between the two microdies 50a and 50b.

The alternating current microdie light-emitting module 5 comprises at least two microdies 50a and 50b and a concave portion 51 disposed between the two microdies 50a and 50b. Unlike the first embodiment, the second embodiment discloses etching a sidewall of the microdies 50a and 50b in such a way that the sidewall becomes oblique rather than vertical, by controlling the appearance of an etching mask or controlling etching speed, for example. As a result, the concave portion 51 disclosed in the second embodiment comprises an oblique sidewall such that the concave portion 51 is readily filled with an insulating filler in a liquid state, thus preventing formation of bubbles which may otherwise ruin a flat top surface of the insulating filler-filled concave portion 51 when the bubbles expansion upon heating in an ensuing process.

Third Embodiment

Figure 3:
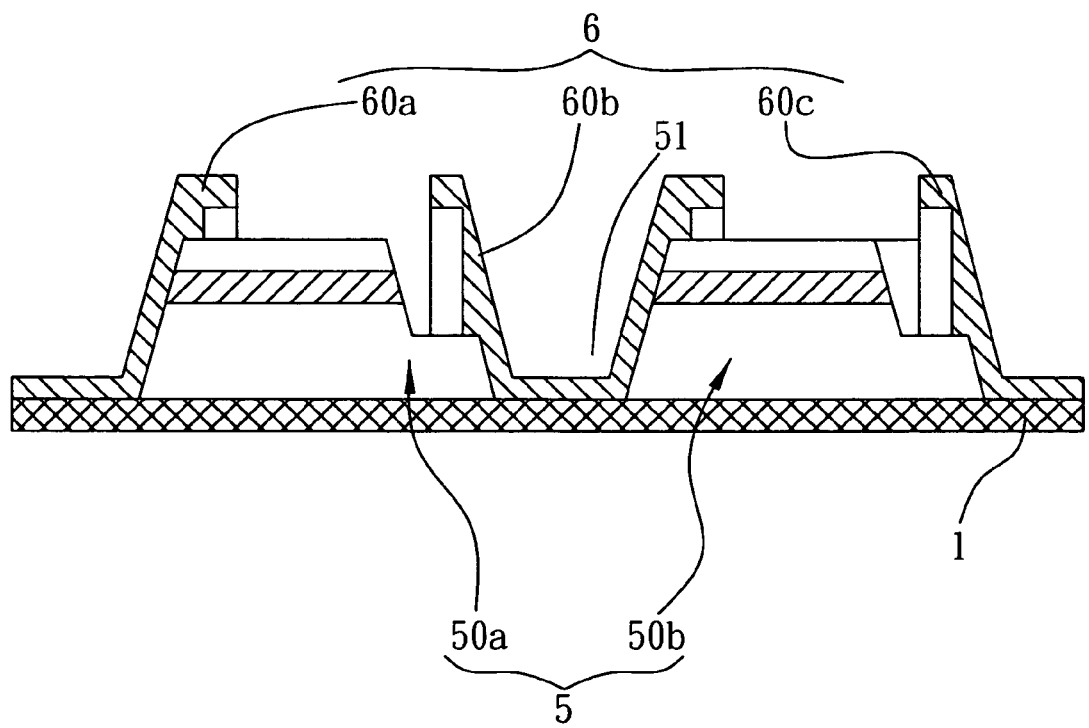
FIG. 3 is a cross-section showing the third embodiment of an alternating current light-emitting device of the present invention.

FIG. 3 is a drawing showing the third embodiment of an alternating current light-emitting device of the present invention. To make the description simpler, like components are denoted alike, and the description rarely goes into detail.

Unlike the third embodiment, the second embodiment discloses filling a concave portion with an insulator. By contrast, the third embodiment discloses forming a conductive structure directly on a concave portion instead of filling the concave portion with the insulator.

The alternating current light-emitting device shown in FIG. 3 comprises a substrate 1, an alternating current microdie light-emitting module 5 formed on the substrate 1 and having two microdies 50a and 50b, and a conductive structure 6 providing an electrical connection function and having conductors 60a, 60b and 60c.

The alternating current microdie light-emitting module 5 comprises at least two microdies 50a and 50b and a concave portion 51 disposed between the two microdies 50a and 50b. Unlike the first embodiment, the third embodiment discloses the concave portion 51 having an oblique sidewall and teaches laying conductors 60a, 60b and 60c, such as a metal conductive bridge, directly on the surface of the concave portion 51. Owing to the oblique sidewall, the concave portion 51 comprises a relatively great vertical top plan view area. As a result, enhancement of metallic bonding increases production yield. The third embodiment overcomes a drawback of the prior art, that is, poor step coverage associated with a vertical sidewall. Accordingly, the advantages of the third embodiment are prevention of undue open circuits, prevention of an increase in resistance, enhancement of product yield, and enhancement of photoelectric conversion efficiency.

The aforesaid embodiments merely serve as the preferred embodiments of the present invention. They should not be construed as to limit the scope of the present invention in any way. Hence, any other changes can actually be made in the present invention. It will be apparent to those ordinarily skilled in the art that all equivalent modifications or changes made, without departing from the spirit and the technical concepts disclosed by the present invention, should fall within the scope of the appended claims.

What is claimed is:

1. An alternating current light-emitting device, comprising:
   a substrate;
   an alternating current microdie light-emitting module formed on the substrate and having at least two microdies and a concave portion disposed between the two microdies, each of the microdies having at least one active layer;
   an insulator formed in the concave portion; and
   a conductive structure connecting electrically the microdies and covering the insulator such that the active layers of the microdies take turns to emit light during positive and negative half cycles of alternating current.

2. The alternating current light-emitting device of claim 1, wherein the insulator fills the concave portion.

3. The alternating current light-emitting device of claim 1, wherein the insulator is an insulating filler for filling the concave portion.

4. The alternating current light-emitting device of claim 3, wherein the insulating filler is a material of high resistance.

5. The alternating current light-emitting device of claim 3, wherein the insulating filler is a material selected from the group consisting of Benzo-Cyclo-Butene (BCB), Polyimide, SU8, and Silicon Dioxide.

6. The alternating current light-emitting device of claim 1, wherein the conductive structure comprises a conductor electrically connecting the two microdies.

7. The alternating current light-emitting device of claim 6, wherein the conductor is a conductive bridge.

8. The alternating current light-emitting device of claim 6, wherein the conductor is made of a transparent material and thereby is transparent.

9. The alternating current light-emitting device of claim 1, wherein the substrate is a chip.

10. The alternating current light-emitting device of claim 1, wherein the substrate is an insulating substrate.

11. The alternating current light-emitting device of claim 1, wherein the active layer is a luminescent active layer.

12. The alternating current light-emitting device of claim 1, wherein the active layer has individual ohmic electrodes.

13. The alternating current light-emitting device of claim 1, wherein the concave portion comprises a vertical sidewall.

14. The alternating current light-emitting device of claim 1, wherein the concave portion comprises an oblique sidewall.

15. An alternating current light-emitting device, comprising:
   a substrate;
   an alternating current microdie light-emitting module formed on the substrate and having at least two microdies and an oblique sidewall-equipped concave portion disposed between the two microdies, each of the microdies having at least one active layer; and
   a conductive structure connecting electrically the microdies and covering the concave portion such that the active layers of the microdies take turns to emit light during positive and negative half cycles of alternating current.

16. The alternating current light-emitting device of claim 15, wherein the conductive structure comprises a conductor electrically connecting the two microdies.

17. The alternating current light-emitting device of claim 16, wherein the conductor is a conductive bridge.

18. The alternating current light-emitting device of claim 16, wherein the conductor is made of a transparent material and thereby is transparent.

19. The alternating current light-emitting device of claim 15, wherein the substrate is a chip.

20. The alternating current light-emitting device of claim 15, wherein the substrate is an insulating substrate.

21. The alternating current light-emitting device of claim 15, wherein the active layer is a luminescent active layer.

22. The alternating current light-emitting device of claim 15, wherein the active layer has individual ohmic electrodes.

* * * * *